United States Patent [19]

Smith et al.

[11] 4,106,187

[45] Aug. 15, 1978

[54] CURVED RIGID PRINTED CIRCUIT BOARDS

[75] Inventors: Brian Roger Smith, Bicknacre; Charles Richard Jarvis, Hockley; Stephen Martin Payne, Chelmsford; Robert John Potts, Maldon; Frank Wallis, Chelmsford, all of England

[73] Assignee: The Marconi Company Limited, England

[21] Appl. No.: 649,673

[22] Filed: Jan. 16, 1976

[30] Foreign Application Priority Data

Jan. 18, 1975 [GB] United Kingdom ................. 2264/75

[51] Int. Cl.² .............................................. H05K 3/06
[52] U.S. Cl. .................................................... 29/625
[58] Field of Search .......................... 29/625, 624, 525; 174/68.5; 427/96, 97, 98, 123, 125; 156/222; 204/32 R

[56] References Cited

U.S. PATENT DOCUMENTS

| 2,342,988 | 2/1944 | Vidal | 156/222 |
|---|---|---|---|
| 2,958,928 | 11/1960 | Bain, Jr. et al. | 29/625 |
| 3,214,315 | 10/1965 | Hildebrand | 29/625 |
| 3,311,966 | 4/1967 | Shaheen et al. | 29/625 |
| 3,366,519 | 1/1968 | Pritchard, Jr. et al. | 29/625 X |
| 3,650,021 | 3/1972 | Karol | 29/625 X |
| 3,763,551 | 10/1973 | Herron | 29/625 X |
| 3,816,907 | 6/1974 | Small | 29/625 X |
| 3,873,429 | 3/1975 | Brown | 29/625 X |
| 3,940,534 | 2/1976 | Fick et al. | 427/96 X |

Primary Examiner—Travis S. McGehee
Assistant Examiner—Horace M. Culver

[57] ABSTRACT

A curved printed circuit board is made in accordance with a method which ensures accurate registration between printed circuit patterns carried by the two outer surfaces of the board.

9 Claims, 3 Drawing Figures

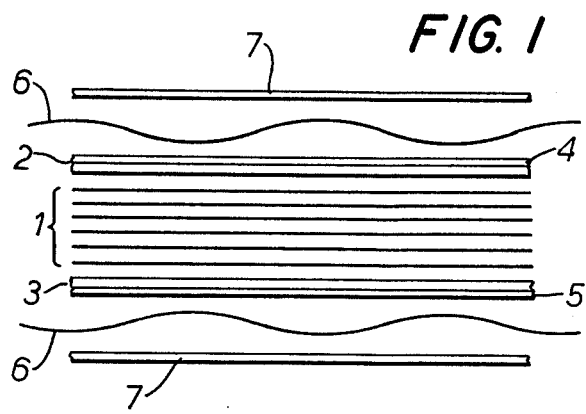
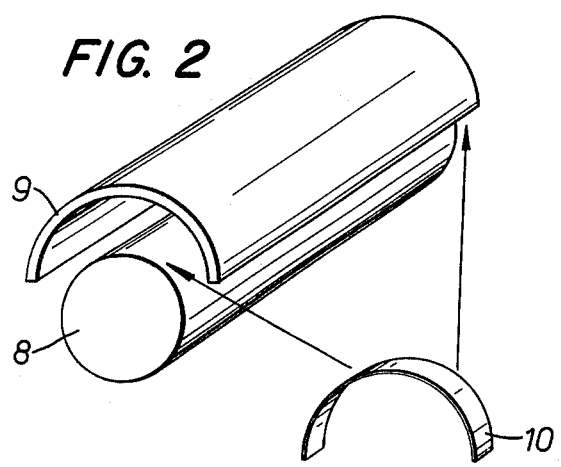
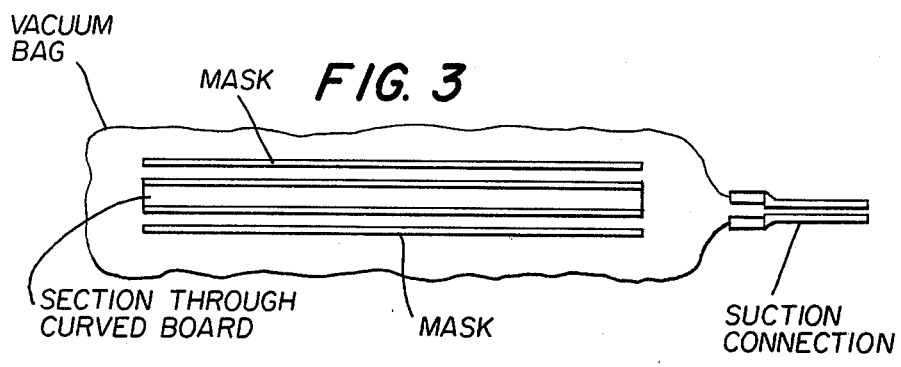

CURVED RIGID PRINTED CIRCUIT BOARDS

This invention relates to curved rigid printed circuit boards, and more particularly to double sided boards. As is known double sided printed circuit boards are at present extensively used to provide electrically conductive interconnections between, and support for, components forming electronic circuits and the like. Printed circuit boards can be very complex, and often must be manufactured to a very high degree of accuracy both to increase the attainable packing density of the components forming the circuit, and to keep the overall size of the printed circuit board as small as possible. With double sided boards there is the additional requirement that the circuit printed on each side must be in exact registration with the other. For some applications, particularly where space is at a premium, it would be desirable to use a curved rigid printed circuit board produced to the same high degree of accuracy. The present invention seeks to provide such a curved rigid printed circuit board.

According to this invention a method of making a curved rigid printed circuit board includes the steps of placing a flexible glass cloth impregnated with uncured or partially cured epoxide resin between two thin flexible lamina, the outer face of each of which lamina carries a copper foil; imparting a curve to the laminate so formed; heating said laminate to cure said glass cloth and to form a unitary board thereby; forming registration holes through said board; and selectively removing regions of said copper foils to produce desired printed circuits on both surfaces of said board and in registration with each other.

The registration holes formed through the board may align with registration holes previously formed in each of the two flexible lamina so as to align when assembled, or if no registration holes are already present in the lamina, registration holes are, after curving the board and curing it, formed through the entire thickness of the board.

Although the registration holes could consist of slots or apertures, preferably they are circular holes formed by drilling the board.

Preferably, the registration holes are used to permit registration therewith of a printed visible pattern formed on one surface of the board and which indicates the locations at which plated through holes are to be formed to provide electrical connection between the two faces of the board.

After said locations have been drilled to form holes passing through the board, the said visible pattern is removed and copper is deposited on the surfaces of the board and on the inner surfaces of said holes.

Preferably both surfaces of the board, including the holes, are coated with a positive working photoresist.

Preferably again, two photomaster masks are placed in contact with both surfaces of the board and aligned with said registration holes and simultaneously exposed to light.

The photomaster masks may conveniently be held in contact with the board by means of a vacuum bag. In addition to ensuring the required close contact, the use of vacuum pressure reduces the risk of movement of the masks during exposure.

After the photoresist has been exposed, it is developed, and the copper is selectively etched in well known manner to leave the desired printed circuit pattern, after which the remaining photoresist is removed.

The invention is further described by way of example with reference to the accompanying drawings in which FIG. 1 shows a laminate in accordance with the present invention prior to assembly, and FIG. 2 shows in diagrammatic form a simple press which is employed to impart a curve to the laminate.

FIG. 3 shows a laminate and photomaster mask assembly inside a vacuum bag which holds the mask against the laminate during exposure.

The drawings are used to illustrate a preferred method of making a curved rigid printed circuit board. Referring to FIG. 1, flexible sheets of partially cured epoxide impregnated glass cloth 1 are positioned between a pair of thin lamina 2, 3 each having a thin copper foil 4, 5 present on its outer surface. FIG. 1 is not to scale, the thickness of the layers and the spacing between them being greatly exaggerated for the sake of clarity. The cloth 1 consists of a number of individual thin layers of impregnated glass cloth, enough layers being provided to result in a printed circuit board of sufficient thickness and strength. On either side of the sandwich so formed a release film 6 is provided. The release film can be, for example, poly-vinyl-fluoride (p.v.f.). A further sheet 7 of material is provided in contact with the outer faces of the release films 6. This further sheet is composed of a slightly compressible deformable material such as blotting paper or the like which serves to give even distribution of pressure.

This composite assembly of layers is placed in the press shown in FIG. 2, between a solid metal cylinder 8 and an arcuate metal shoe 9. Metal shims 10 are placed at each end, they typically could be made of brass or aluminium. These shims, however, are not essential and can be omitted if preferred. The press is tightened using worm-drive clips (not shown) which pass around the cylinder 8 and the shoe 9 so as to squeeze the different layers of the laminate into intimate contact. The temperature of the press is raised sufficiently to effect complete curing (or polymerisation) of the epoxide resin with which the glass cloth 1 is impregnated. This can conveniently be achieved by placing the whole assembly into an oven. Typically a temperature of about 150° or above, for one hour is sufficient for this purpose. The curing of the epoxide resin imparts rigidity to the laminate, and serves to bond the layers together to form a unitary board. The press is then cooled — it can be rapidly cooled by immersion in cold water. The board is then removed, the presence of the release films assisting in easy removal without damage to the outer copper foils of the board.

Tooling or registration holes are next formed in the rigid curved board. These registration holes ensure alignment of the various masks that are used in subsequent process steps, and are conveniently formed by drilling small holes where necessary.

The internal surface of the curved board is cleaned and coated with a dyed photoresist (positive or negative can be used). The photoresist may be applied by dipcoating.

A photomaster mask is placed in contact with this inner surface and held there by means of a flexible vacuum bag which is transparent to ultra violet light. This bag is transparent and envelopes the board and the mask. By producing a vacuum within the bag, it is deflated by suction, and ensures close contact between the mask and the board. Tooling pins are used to align the photomaster mask with the registration holes. After the photoresist has been exposed to ultraviolet light, the photomaster mask is removed and the photoresist developed to produce a visible pattern. Using this visible pattern the board is drilled as necessary to produce the holes that will eventually be used to provide electrical connections between the printed circuits formed on the two opposing faces of the board.

The dyed photoresist pattern is removed and the whole board and the inner surfaces of the holes are plated with copper using an electroless plating technique to form what are known as plated-through holes. This is followed by electroplating to build up a required thickness of copper, especially inside the holes. After this the board is cleaned, and completely coated (including the holes) with positive working photoresist. Using the vacuum bag as before, photomaster patterns or masks are held in contact with both faces of the board, and exposed to light, after which the photoresist is developed. At this stage a check is made that all holes are protected with photoresist.

The regions of the copper surface not protected by the photoresist are removed by a suitable etchant, e.g. chromic acid. Agitation of the etchant can be achieved by bubbling air through a bath of the solution to ensure satisfactory etching. After etching, the photoresist is removed from the laminate to leave the finished printed circuit board.

The method described above can be varied, and the following variation results in less copper being etched from the board, allowing conductor definition to be improved. Instead of using a positive-working photoresist as previously, a liquid negative-working photoresist is used for both the drilling patterns and subsequent processing, but the use of positive photomasters is retained. After the registration holes have been formed, and the board has been drilled as necessary to produce the holes that will eventually be used to provide electrical connections between the various layers of printed circuits, the entire board is covered with copper laid down by electroless deposition. The inner surfaces of the holes are also covered with copper in this way at the same time, after which the thickness of the copper is increased slightly by a short period of electroplating. The negative-working photoresist pattern is then laid down.

The use of negative-working photoresist in combination with positive photomasters means that after the exposure and development of the photoresist, the conductors and holes are exposed copper and the remaining areas (i.e. those areas of copper which are eventually to be removed) are covered with photoresist. The exposed conductors and holes are next again electroplated with copper, followed by tin-lead alloy using the photoresist pattern as a mask. The remaining photoresist is removed, and the unwanted, relatively thin, areas of copper are etched away using the tin-lead coating as an etchant resist to protect the conductors and the holes. The tin-lead alloy constitutes a solderable coating.

The invention can also be used for the manufacture of multilayer printed circuit boards by inserting inner layers (which carry appropriate printed circuit conductive patterns) between the two outside thin flexible lamina before the composite laminate is curved and cured. In this case registration holes are present in these inner layers and the two outer layers before the composite board is curved and cured to ensure that the inner layers of printed circuit patterns are properly positioned. However, as before, after curving and curing, registration holes are made right through the composite board, including the glass cloth impregnated with epoxide resin. Subsequently the printed circuit patterns are formed on the outside surfaces of the composite board, using the registration holes which pass right through the board to ensure that the patterns on the two surfaces are accurately aligned with each other.

These methods are suitable for large scale production techniques, use only readily available materials, and provide a way of ensuring that the circuits on both outside surfaces of the board are accurately aligned with each other. Although in the examples the board is formed into a simple arcuate curve, other more complex profiles can be adopted as desired. The shape of the curve is chosen with regard to the space available in which to mount the completed printed circuit board.

We claim:

1. A method of making a curved printed circuit board including the following sequence of steps:
    (a) placing a flexible glass cloth impregnated with uncured or partially cured epoxide resin between two thin flexible lamina, the outer face of each of which lamina carries a copper foil;
    (b) imparting a curve to the laminate so formed;
    (c) heating said laminate while curved as in step (b) to cure said epoxide resin and to form a unitary board thereby;
    (d) forming registration holes through said board;
    (e) using the registration holes of step (d) to permit registration therewith of a printed visible pattern formed on one surface of the board and which indicates the locations at which plated-through holes are to be formed to provide electrical connection between the two faces of the board and then forming holes at said locations; and
    (f) selectively removing regions of said copper foils to produce desired printed circuits on both surfaces of said board and in registration with each other.

2. A method as claimed in claim 1 wherein the registration holes are circular holes formed by drilling the board.

3. A method as claimed in claim 1 wherein after said holes have been formed at said locations, the visible pattern is removed.

4. A method as claimed in claim 3 wherein copper is deposited on the surfaces of the board and on the inner surfaces of said holes at said locations.

5. A method as claimed in claim 4 wherein both surfaces of the board, including the holes at said locations are coated with a positive working photoresist.

6. A method as claimed in claim 5 wherein two photomaster masks are placed in contact with both surfaces of the board and aligned with said registration holes and simultaneously exposed to light.

7. A method as claimed in claim 6 wherein the photomaster masks are held in contact with the board by means of a vacuum bag.

8. A method as claimed in claim 3 wherein copper is deposited over the surfaces of the board and the inner surfaces of said holes at said locations, followed by a coating of negative-working photoresist, selected regions of which are exposed to light by means of positive photomasters held in contact with the surfaces of the board.

9. The method of making a curved printed circuit board of the double sided type, which comprises the following sequence of steps:

(a) providing a laminate which comprises two thin flexible lamina and flexible glass cloth impregnated with uncured or partially cured epoxide resin between such lamina, said lamina having copper foil defining the outer faces of the laminate;

(b) imparting a curve to the laminate of step (a) and heating the laminate to cure the epoxide resin to form a unitary, curved board;

(c) forming a plurality of registration holes through the curved board;

(d) applying resist material to at least one of the copper foil outer surfaces of the board;

(e) accurately registering a plated-through hole mask with said one outer surface by means of said registration holes and developing said resist material to provide a visible pattern accurately indicating the locations of plated-through holes in the board;

(f) forming holes through said board according to said visible pattern;

(g) removing the resist material applied in step (d) and plating said board with copper to provide plated through holes conductively joining the copper outer surfaces of the board;

(h) applying resist material to the outer surfaces of said board;

(i) accurately registering printed circuit pattern masks with said outer surfaces of the board by means of said registration holes, and exposing said resist material through said pattern masks; and (j) selectively removing regions of said outer surfaces of said board in accord with the patterns developed in step (i) to provide the desired printed circuits on both surfaces of the board with accurate registration between said printed circuits.

* * * * *